United States Patent [19]

Rütt

[11] Patent Number: 4,806,884

[45] Date of Patent: Feb. 21, 1989

[54] HIGH FREQUENCY GENERATOR

[75] Inventor: Winfried P. Rütt, Büttelborn, Fed. Rep. of Germany

[73] Assignee: Elan Elektronische Anlagen GmbH, Büttelborn, Fed. Rep. of Germany

[21] Appl. No.: 25,162

[22] Filed: Mar. 12, 1987

[30] Foreign Application Priority Data

Mar. 17, 1986 [DE] Fed. Rep. of Germany ....... 3608871

[51] Int. Cl.$^4$ .............................................. H03B 5/18
[52] U.S. Cl. ........................... 332/31 R; 331/117 FE; 331/168; 328/80
[58] Field of Search ...................... 332/31 T, 43 R, 59; 331/37, 167, 168, 117 R, 117 FE; 455/102, 110, 111, 120, 122, 124; 334/47; 328/56, 80, 106

[56] References Cited

U.S. PATENT DOCUMENTS 3,139,586  6/1964  Dolan ................................ 328/80 X
4,528,524  7/1985  Bert ......................... 331/117 FE X Primary Examiner—Eugene R. Laroche
Assistant Examiner—Robert J. Pascal
Attorney, Agent, or Firm—Toren, McGeady & Associates

[57] ABSTRACT

A high frequency generator for sinusoidal output power includes an LC-parallel resonance circuit as an output circuit. A plurality of HF-modules of small output are coupled to the output circuit. Each HF-module consists of a controlled switch S1.1, S1.2, which is wired with a λ/4-line LL1, LL2. The coupling-in of the sinusoidal high frequency power occurring at the outputs of the λ/4-lines LL1, LL2 onto the output circuit occurs through coupling condensers CK1, CK2 and primary coils L1, L2. The voltage supply $U_B$ is provided by a timed circuit network portion 1, to which the line voltage 2 and a desired value 3 for the modulation of the HF-output power are fed. The operating voltage UB is fed to each HF-module through its own switch S2.1, S2.2, a filter condenser CL1, C12 and a λ/4-line LL7, LL8. Short-circuiting switches SK1, SK2 in parallel with each control switch S1.1, S1.2 see to it, in case of a switch malfunction, that the output circuit is only minimally detuned.

28 Claims, 3 Drawing Sheets

HIGH FREQUENCY GENERATOR

BACKGROUND OF THE INVENTION

1. Field of the Invention:

The invention is directed to a modulatable, separately excited high frequency generator for a sinusoidal power output.

Description of the Related Art

Such a circuit for a power amplifier operating in the so-called F-mode is, for instance, known from the book by Kovacs: "High Frequency Applications of Semiconductor Devices"; Franzis Publisher Munich, 1977, page 387. The known circuit comprises a MOS-FET-transistor (metal oxide semiconductor field effect transistor) operating in the switching mode, which is matched with a λ/4-transformer. A parallel resonant circuit at the output tuned to the fundamental frequency short-circuits the harmonic waves. Because of the λ/4-transformer, there develops at the drain point of the field effect transistor, a short-circuit behavior for even harmonics and an idling behavior for odd harmonics.

Because of the idling behiavior, the drain current does not contain any odd harmonics of the fundamental frequency. The even harmonics of the fundamental frequency, on the other hand, circulate in short-circuit and therefore do not consume any power. This results in a very high efficiency of the circuit, which, in the ideal case, amounts to 100%. In the actual application case, the efficiency of the circuit is reduced by the relationship between the impedance R of the λ/4 line and the saturation resistance $R_{ON}$ of the switching transistor according to the formula $\eta_F = R/(R + 2 R_{ON})$. The efficiency is thus greater by approximately 27% than that of the class B push-pull power amplifier which is routinely used these days.

That this known circuit principle has up to today found no practical entry into the technology, should be traceable to several reasons. One reason is to be seen in the necessity of having to utilize a λ/4 line; such a line has a length of several meters in the technical frequency range. Another reason would lie in the lack of sufficiently powerful switching transistors, in particular, field effect transistors. A third cause can be found in that a modulation of the power output is only possible by means of a direct voltage supply, whereby, with the usual technology, the overall efficiency of the circuit again drops below that of a class B power amplifier.

SUMMARY OF THE INVENTION

An object of the present invention is to provide a high frequency generator of the previously mentioned type, which retains the advantages of the class F power amplifier, is expandable onto any desired high power output and can be modulated with high efficiency.

This object is achieved in a modulatable, externally excited high frequency generator, wherein a plurality of switches are coupled to an LC output circuit through respective λ/4 lines and a direct voltage supply of the generator is a timed power supply unit of high efficiency.

The present invention thus does not follow the obvious path to arrange several switching transistors in parallel for increasing the switching power and for lowering the saturation resistance; this would entail the necessity of switching additional resistances in series with the individual switching transistors, in order to attain a uniform power distribution. Instead, the present invention creates individual switching modules form a switch and a λ/4 line and has only these modules then act in parallel on the output circuit. Herein, the impedance of the λ/4 line is taken advantage of for power distribution and limitation. In this manner, it is even possible to use switching unit modules of differing power output capacity. Additionally, this modular technology also permits particularly rapid repairs in case of malfunction.

The known timed circuit network portions can expediently be used as a direct voltage supply. The high efficiency of these network portions over the entire range is basically known. In addition, the modulation of the high frequency generator by means of the direct voltage supply has the additional advantage that the entire voltage is applied to the switches only in case of maximum output power, while under the usual reduced power output, the voltage applied to the switches is also reduced. Through this, for instance, mismatching of the output does not result in malfunctions.

If a specific circuit network portion is not available, a constant voltage network portion of conventional technology can also be utilized with a timed switch located downstream, through whose on-off relationship or switching frequency the direct voltage supply can be modulated. The coupling circuit between the timed switch and the high frequency generator then is formed by a charging choke with a charging capacitor and a freewheel diode or with a charging capacitor.

Additionally there exists the possibility to provide the coupling circuit in the direct voltage supply itself as a λ/4 line. Such a line transforms the high frequency short-circuit on the direct voltage side into an idling operation on the alternating voltage side, so that the high frequency is minimally dampened.

Since, in practical operation, it is always to be expected that one of the switching modules drops out of service, for instance, through breakdown of the switching transistor, one has to make provisions in order to keep the consequences of such a failure as small as possible. For this purpose, each switch is provided with the direct voltage through it own coupling circuit, wherein, preferably, an interrupter switch, similar to a circuit breaker, and a charging capacitor as a high frequency short-circuit are included on the direct voltage side in each coupling circuit. Thus the direct voltage supply to the defective module is switched off with this interrupter switch, while the remaining intact modules can continue to function.

In case of a defective switch, two conditions are possible: either the switch is permanently short-circuited or permanently opened. The short-circuit of the switch is transformed by the λ-line into an idling operation; the output circuit is not put under load in case of such a malfunction, the matching because of failure of the impedance of the λ/4 line concerned is only slightly detuned. An open position of the switch, on the other hand, is transformed by the λ/4 line into a short-circuit at the output circuit, which could lead to a considerable interference with the remaining switching modules. In order to prevent this with certainty, a short-circuit switch is wired in parallel with each switch, which, in case of each defect of the switch proper, generates the desired short-circuit at the input of the λ/4 line. Fast mechanical switches are, in most cases, the most suitable ones to serve as short-circuit switches.

The coupling of the individual switching modules to the output circuit can occur by simple parallel switching, for instance, by a common coupling capacitance blocking the direct voltage supply. Preferably, however, each switching module is allotted its own primary winding, through which the power output is coupled by a transformer to the output circuit acting as a tank circuit.

So as not to again jeopardize the possibility of reducing the constructional volume of the high frequency generator, which is basically made possible by reducing the power loss through selection of the class-F-power amplifier, considerable attention has been given to the design of the output circuit collecting the outputs of the individual switching modules and delivering the same to the output side. Preferably, the inductance of the output circuit is constituted by a conductor section, for instance a piece of copper tube, over which at least one annular core is slid. At least one of the primary windings, which are fed by the individual switching modules, is looped through the annular cores.

The capacitance in the output circuit should be tunable for compensation of construction tolerances. For this purpose, the capacitance is constituted by a first metal plate, which is connected with the one end of the conductor piece, and a counter-plate which is insulated against the first plate, wherein the capacitance of the two plates is, for instance, adjustable by changing the spacing or by the insertion in the spacing of insulating materials with a high dielectric constant or an insulated metal plate.

The one of the two metal plates can simultaneously serve as a base plate and be connected with the reference potential of the circuit. Then, it is also possible to erect, with the use of this plate, a shielding cage around the output circuit.

In a modified embodiment form of the invention, the shielding cage acts simultaneously as part of the inductance. For this purpose a conductor section is installed inside a metallic housing, this conductor section being connected at one end with the housing and at the other end with one of the metal plates of the resonant circuit capacitance. Annular cores are also slid over this conductor section for producing the required resonant circuit inductance and for coupling-in the electrical partial power output.

For the case in which a plurality of switching modules are present and, therefore, an excessively large constructional length of the output circuit becomes necessary, it is possible to provide several parallel conductor section inside the housing and to allow one or several switching modules to act upon each conductor section. The electrical power output thus coupled-in is then combined in the housing serving as a common return conductor for all conductor sections.

In order to extract the electrical power output with the required impedance in this type of construction with parallel conductor sections, a tapping of all parallel conductor sections is required. This is preferably realized by a common coupling conductor arranged in a predetermined plane.

In order to reduce the constructional size of the high frequency generator, not only the construction size of the output circuit must be held as low as possible, but also the constructional size of the λ/4 lines. For this purpose, an extremely short design of small construction size was developed, which consists of a slotted copper tube upon which a winding is coiled in an insulated fashion. Such a design permits a shortening of the mechanical conductor length, compared to the conventional lines, by a factor of about 100.

Preferably, a tuning core can be provided in the copper tube, in order to be able to fine-adjust the length of the λ/4 line Because of the minor constructional size, it has, for the rest of it, become possible to also install the λ/4 line into the shielding housing of the output circuit. Thus, any possible interference radiation can, from the beginning, be significantly reduced.

In accordance with an expedient refinement of the invention, the electrical length of the line amounts to an odd multiple of λ/4. Thus it is possible to switch the frequency of the high frequency generator in specific stages without having also to re-switch the matching line. A high frequency generator of this type can therefore be utilized without any problems from the middle frequency range up to the high frequency range. For the rest of it, it is possible without any considerable problems to vary the frequency by about ±10% with respect to the fundamental frequency of the output resonant circuit.

By way of switches, not only the field effect transistors proposed in the previously cited documents can be used, but also mechanical switches, for instance, in the case of frequencies up to approximately 50 Kilohertz, so-called Reed switches, or also tubes, can be utilized up to the highest frequencies.

As already mentioned previously, the electrical efficiency of the circuit is reduced by the relatively high saturation resistance $R_{ON}$ of field effect transistors, if these are utilized. In accordance with an expedient refinement of the invention, a bipolar transistor is therefore connected in parallel to the field effect transistors, which, in the switched-on state, considerably reduces the saturation resistance $R_{ON}$.

As already stated, the unit, consisting of a switch and λ/4 line, should be randomly interchangeable as a module. For this reason, such a module must have standardized interface values. Semiconductor switches, however, have usually relatively strongly scattering parallel capacitances. For this reason, preferably, a standardizing capacitor is shunted with each transistor, with the help of which all modules can be tuned to constant capacitance values.

If the drive of the switching transistors occurs by means of a sinusoidal voltage, then the high input capacitance, especially of MOS-FET-transistors, leads to a considerable power requirement for the recharging of this input capacitance. In order to create improvements here, the input of each transistor is wired with a clamping diode.

Preferably, two transistors are driven in a push-pull cycle with a sinusoidal control voltage; the outputs of these transistors are respectively switched through one λ/4 line onto a push-pull transformer. In this manner, both half-waves of the control voltage can be utilized.

If such a push-pull cycle connection is not desired, a capacitance may be substituted for the one transistor, which then is also wired with a clamping electrode in order not to disturb the symmetry. This is of importance particularly if the driving transformer is brought into resonance with the gate/source capacitance and the capacitance CE, as well as the capacitance of the additional condenser CR, in order to reduce the control power in this manner.

BRIEF DESCRIPTION OF THE DRAWINGS

The invention is described with particularity in the form of embodiment examples with the help of the wherein.

DESCRIPTION OF THE PREFERRED EMBODIMENTS

Figure 1:
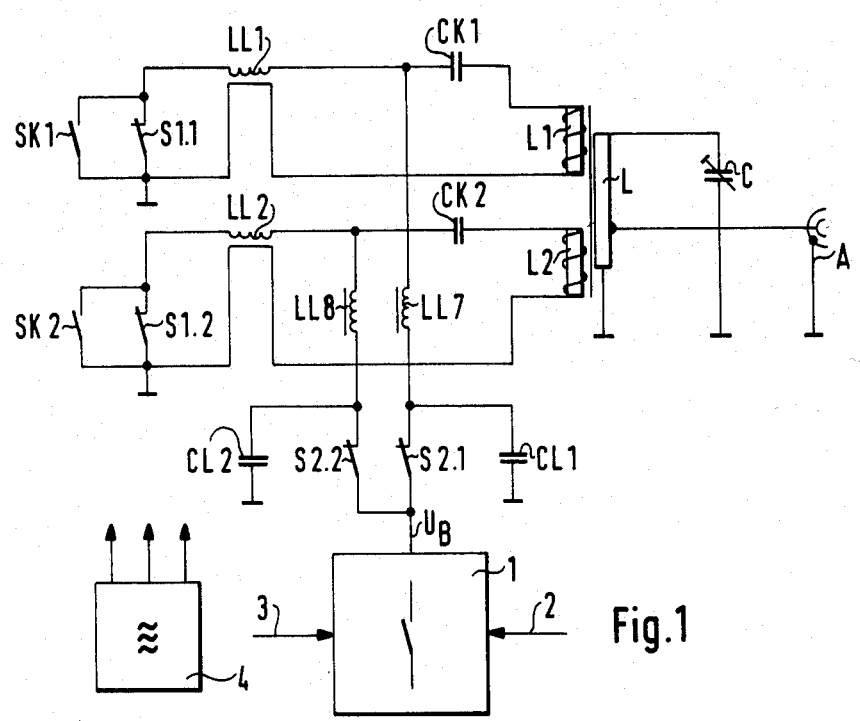
FIG. 1 shows a first circuit arrangement for a modulatable separately excited high frequency generator with sinusoidal output voltage.

In FIG. 1, a circuit arrangement with two switching modules is shown. The switching modules consist of, respectively, controlled switches S1.1, S1.2, λ/4-line LL1, LL2, coupling capacitances CK1, CK2 and a primary windings L1, L2 for coupling the electrical outputs onto the inductance L of the output circuit LC. The capacitance C of the output circuit LC is tunable to the fundamental frequency. At the output A, the entire electrical power output of all of the switching modules is available.

An oscillator 4 generates the driving output for the switches S1.1, S1.2. Short-circuiting switches S1, SK2 is wired in parallel with switches S1.1, S1.2, respectively. The short-circuiting switch SK1 or SK2 is closed in case of malfunction of the switch S1.1 or S1.2 assigned to it. The short-circuiting switches SK1 and SK2 can preferably be designed as fast mechanical switches, even if the switches S1.1, S1.2 themselves are designed as semiconductor switches or electron tubes.

The constant voltage supply occurs directly via a times circuit network portion 1, to which the line voltage 2 and the desired value 3 for the modulation of the high frequency output is supplied. The direct voltage is fed through respectively one switch S2.1, S2.2, serving as a circuit breaker and, respectively, one additional λ/4-line LL7, LL8. The feeding of the supply voltage UB is possible not only as depicted in FIG. 2 between the coupling condenser CK and the λ/4 line LL, but also directly to the switches S1.

In case of malfunction, for instance damage to one of the switches S1, the associated circuit breaker switch S2 is opened and the associated short-circuiting switch SK is closed. The λ/4 line LL transforms the short-circuit of the short-circuiting switch SK into an idling operation at the output, so that the output circuit LC is no longer carrying same. The slight detuning of the matching through the λ/4-line which has been made ineffective by becoming highly resistive, can be tolerated the more so, the more switching modules operate upon the output circuit LC.

Figure 2:
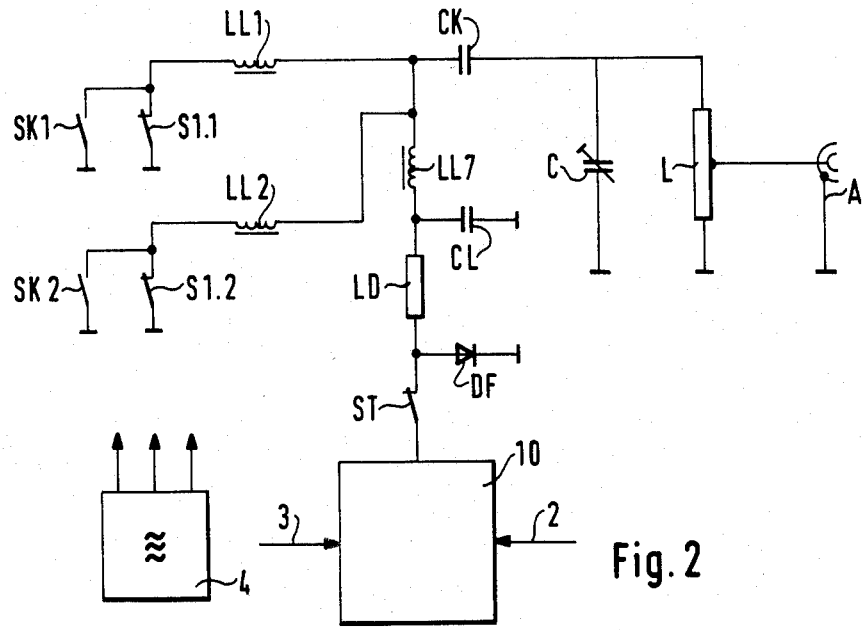
FIG. 2 shows a second circuit arrangement.

FIG. 2 shows a somewhat modified circuit arrangement. Here, the switching modules are coupled together at the same voltage and feed their electrical output through a common coupling capacitance CK into the output circuit LC. Such a direct current-like parallel connection is easily possible, since the impedance of the λ/4 line LL1, LL2 takes care of the desired and required loss-free distribution of the power onto the individual switches S1.1, S1.2. In this type of design, an untimed constant voltage network portion 10 is utilized. In order to be able, in spite of that, to vary the high frequency output power without reducing the efficiency, a timed switch ST is placed between the network portion 10 and the high frequency genertaor, whose on/off ratio or timing frequency generates the desired modulation. In order to assure a perfect functioning of the circuit, the coupling connection to the high frequency generator is realized with a charging choke LD, a charging condenser CL and a freewheel diode DF.

Figure 3:
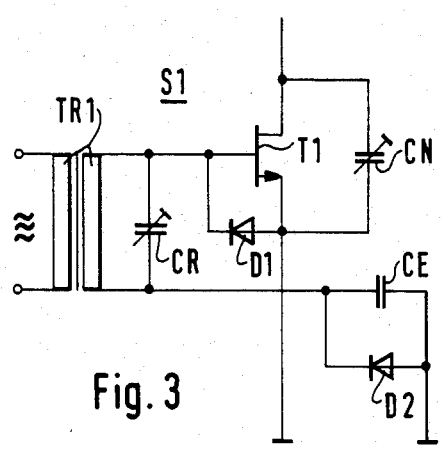
FIG. 3 shows a circuit arrangement for a switch with a field effect transistors.

FIG. 3 shows a possible embodiment form for the switch S1. The control voltage generated by a (not depicted) high frequency generator is applied to a transformer TR1. The one terminal of the transformer TR1 is directly connected to the gate of a field effect transistor T1, while the other terminal is conducted to a substitute capacitance CE. This substitute capacitance Ce reconstitutes the gate capacitance of the transistor T1. Clamping diodes D1, D2 at the input of the transistor T1 and the substitute capacitance CE reduce the undesirable charging in particular of the gate capacitance during the blocking phase of the transistor T1.

The standardizing condenser CN is additionally noteworthy, which condenser is wired in parallel with the transistor TR1. With the help of this standardizing condenser CN, the overall capacitance of the module can be tuned to constant values, which makes the transistor module freely interchangeable. The control circuit is tuned with a resonant condenser CR.

Figure 4:
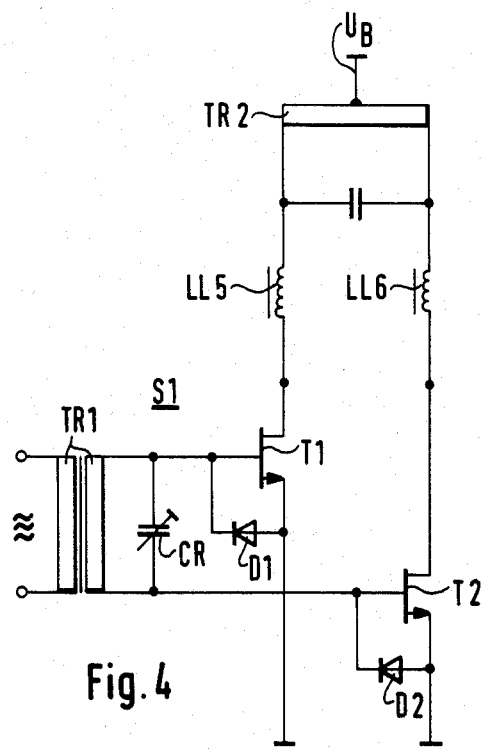
FIG. 4 shows an additional circuit arrangement for a switch with two field effect transistors driven in a push-pull cycle.

A push-pull connection is depicted in FIG. 4, with which both half-waves of the sinusoidal control voltage transmitted through the input transformer CR1 are used. The two transistors T1, T2 are alternately switched on and off. Their outputs are switched by, respectively, one λ/4-line LL5, LL6 to a primary winding of a push-pull transformer TR2. The supply direct voltage UB is fed to its central tapping point.

Since, for reducing the high frequency output power, the supply direct voltage UB is also reduced, the switches S1 or the therein utilized electronic components, for instance transistors T1, T2, are subjected to the full voltage loading only when the maximum output power is required. Since the apparatus, however, as a rule, is only operated with reduced power, there results therefrom a better preservation of the electronic components.

Figure 5:
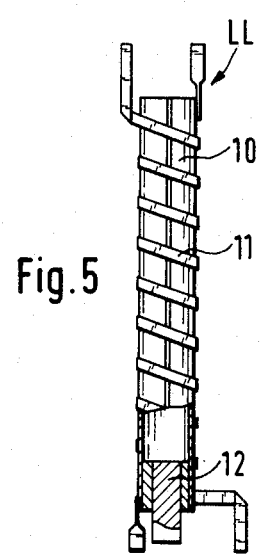
FIG. 5 shows a schematic view of a λ/4-line.

FIG. 5 shows the design of a λ/4-line of extreme mechanical shortness. A copper tube 10 is slotted in order to increase the quality of the line LL. An insulated winding 11 is wound around the copper tube 10. At one end of the copper tube 10 is a tuning core 12, with which the electrical length of the λ/4-line can be fine-tuned. In a line of this type built in actual practice, the length could be reduced to less than 9 cm at a frequency of about 14 Megahertz, while the λ/4-wavelength in the vacuum amounts to more than 5 m. In this connection it has to naturally be taken into account that powers of several hundred watts flow through each λ/4-line, depending on the switching power of the circuit breaker utilized.

Figure 6:
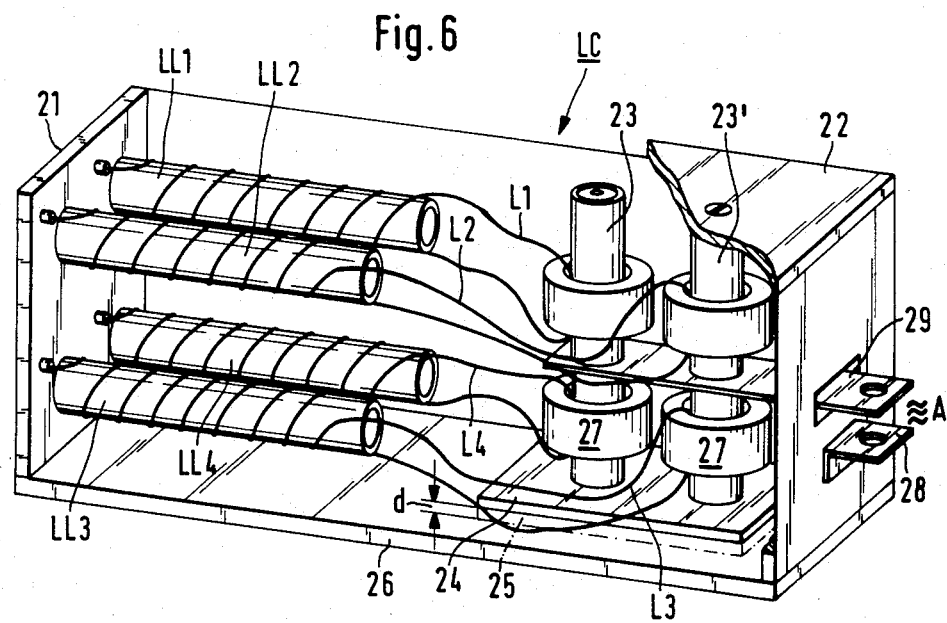
FIG. 6 shows a schematic diagram of an LC (inductance-capacitance) output circuit.

In FIG. 6 a possible embodiment form of the output circuit LC is shown. A closed rectangular housing 21 is provided in which, for instance, four λ/4-lines LL1 . . . LL4 are arranged. Furthermore, two parallel conductor pieces 23, 23' are connected at their upper ends with the cover 22 of the housing 21. The lower ends of the conductor pieces 23, 23' are connected with the metal plate 24, which is spaced by a distance d from the bottom 26 of the housing 21. The metal plate 24 and the bottom 26 act as a condenser, wherein for tuning the capacity, either the spacing d is varied or a material with a high dielectric constant or an insulated metal plate is slid, more or less far, into the slot.

Annular cores 27 are slid upon the parallel conductor pieces 23, 23'. Primary windings L1 ... L4 are looped over these annular cores, which are directly connected with the ends of the $\lambda/4$-lines LL1 ... LL4. The electrical output originating from the switching modules is coupled to the output circuit LC through these primary windings.

In this embodiment, the housing 21, 22, 26 acts as a common return conductor for the two parallel conductor pieces 23, 23'.

In order to receive the electrical power collected in the output circuits of the two parallel conductor pieces 23, 23' with the same impedance and with the same strength, a coupling metal plate 29 is arranged at a level corresponding to the desired impedance and is led out of the housing 21. The opposite terminal is attached at the external side of the housing 21. The opposite terminal is attached at the external side of the housing 21 in the form of an angular metal plate 28. If other impedance values are desired, the output voltage can, for instance be tapped directly between the condenser plate 24 and the bottom plate 26. It is possible, in all cases, to ground the housing 21 in a direct voltage manner. In addition, it acts as a shielding for the reduction of possible interference radiation.

In spite of the fact that, in principle, another mechanical embodiment of the output circuit LC is also possible, an embodiment with practically straight conductor pieces 23, 23' with slid-on annular cores 27 has been shown to be the optimum as far as a reduction of the structural shape is concerned. It is especially possible with this design to couple nearly a random quantity of switching modules by a transformer to the output circuit. Thus the power which can be taken off the output A can be increased in practice as much as is desirable, without that expensive elements, especially expensive high capacity transistors, have to be used.

I claim:

1. Modulatable, externally excited high frequency generator for sinusoidal output power, containing a LC-parallel resonant circuit as an output circuit; first switching means coupled to said output circuit by a first $\lambda/4$-line and a coupling condenser; and a direct voltage supply with a coupling circuit means blocking alternating voltages, characterized in that a plurality of first switching means are coupled to the output circuit by respectively $\lambda/4$-lines, and the direct voltage supply is a timed power supply unit of high efficiency.

2. High frequency generator according to claim 1, characterized in that the direct voltage supply comprises a constant voltage circuit and second switching means is connected to an output line of said constant voltage circuit, an on-off ratio of said second switching means modulating the direct voltage.

3. High frequency generator according to claim 1 or 2 characterized in that each coupling circuit in the direct voltage supply comprises a $\lambda/4$-line.

4. High frequency generator according to claim 1, characterized in that coupling circuit means comprises a charging choke, a charging condenser and a freewheel diode DF.

5. High frequency generator according to claim 1, characterized in that coupling circuit means comprises a plurality of coupling circuits for respectively supplying an output voltage UB of said direct voltage supply to said plurality of first switching means.

6. High frequency generator according to claim 5, characterized in that each coupling circuit comprises second switching means and a charging condenser.

7. High frequency genertor according to claim 1, characterized in that a short-circuiting switch is provided in parallel with each of said plurality of first switching means.

8. High frequency generator according to claim 1, characterized in that the first $\lambda/4$-lines are coupled to the output circuit through respective primary windings.

9. High frequency generator according to claim 1, characterized in that an inductance of the output circuit comprises a conductor, an annular core being slidably positioned on said conductor.

10. High frequency generator according to claim 9, characterized in that the $\lambda/4$-lines are coupled to the output circuit through respective primary windings, and at least one of the primary windings is looped through the annular core.

11. High frequency generator according to claim 9, characterized in that the conductor is bent in a U-shaped manner, wherein one leg is connected with a first metal plate and the other leg with a second metal plate, said first and second metal plates together forming a condenser of the output circuit.

12. High frequency generator according to claim 11, chracterized in that the output circuit is built into a metallic housing which constitutes one of said metal plates 26.

13. High frequency generator according to claim 9, characterized in that the conductor is connected, on one side, with a metal plate, and that a metallic housing is provided, which surrounds the conductor and constitutes one part of the inductance and, with the metal plate, constitutes a condenser of the output circuit.

14. High frequency generator according to claim 9, characterized in that several parallel conductors are provided.

15. High frequency generator according to claim 14, characterized in that the parallel conductors are tapped in a predetermined plane by a common coupling conductor.

16. High frequency generator according to claim 1, characterized in that each first $\lambda/4$-line has an electrical length which amounts to an odd multiple of $\lambda/4$.

17. High frequency generator aaccording to claim 1, characterized in that the first $\lambda/4$-lines each comprises a slotted copper tube, upon which a winding is coiled in an insulated manner.

18. High frequency generator according to claim 17, characterized in that a tuning core is provided in each copper tube.

19. High frequency generator according to claim 1 characterized in that the first $\lambda/4$-lines are inserted in a housing of the output circuit.

20. High frequency generator according to claim 1, characterized in that the plurality of first switching means comprises mechanical reed switches 21. High frequency generator according to claim 1, characterized in that the plurality of first switching means comprise electron tubes.

22. High frequency generator according to claim 1, characterized in that the plurality of first switching means comprise FET- or MOS-FET-transistors.

23. High frequency generator according to claim 1, characterized in that each of said plurality of first switching means comprises a field effect transistor and a bipolar transistor connected in parallel.

24. High frequency generator according to claim 22, characterized in that a standardizing condenser is connected in parallel to each transistor.

25. High frequency generator according to claim 22, characterized in that an input of each field effect transistor is wired with a clamping diode.

26. High frequency generator according to claim 1, characterized in that each of said plurality of first switching means comprises two transistors which are activated in a push-pull manner, outputs thereof being connected to a push-pull transformer through respective $\lambda/4$-lines.

27. High frequency generator according to claim 22, characterized in that a control transformer is provided for activating the plurality of first switching means, a secondary winding thereof being connected to a input of a respective one of the transistors and to a corresponding substitute circuit having a substitute condenser and a clamping diode.

28. High frequency generator according to claim 1, characterized in that the plurality of first switching means are activated at a frequency which is adjustable.

* * * * *